US009245643B2

(12) United States Patent
Gurgi et al.

(10) Patent No.: US 9,245,643 B2
(45) Date of Patent: Jan. 26, 2016

(54) DISTORTION CANCELLATION IN 3-D NON-VOLATILE MEMORY

(71) Applicant: Apple Inc., Cupertino, CA (US)

(72) Inventors: Eyal Gurgi, Petah-Tikva (IL); Micha Anholt, Tel Aviv (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/811,103

(22) Filed: Jul. 28, 2015

(65) Prior Publication Data

US 2015/0332782 A1 Nov. 19, 2015

Related U.S. Application Data

(63) Continuation of application No. 13/897,944, filed on May 20, 2013, now Pat. No. 9,122,403.

(51) Int. Cl.
*G06F 12/00* (2006.01)
*G11C 16/34* (2006.01)
*G11C 16/26* (2006.01)
*G11C 11/56* (2006.01)
*G06F 12/02* (2006.01)

(52) U.S. Cl.
CPC ........ *G11C 16/3427* (2013.01); *G06F 12/0246* (2013.01); *G11C 11/5671* (2013.01); *G11C 16/26* (2013.01); *G11C 16/3431* (2013.01)

(58) Field of Classification Search
CPC ............ G06F 12/0246; G11C 16/3427; G11C 16/3431
See application file for complete search history.

(56) References Cited

U.S. PATENT DOCUMENTS

| 7,236,389 | B2 | 6/2007 | Hsu | |
|---|---|---|---|---|
| 8,719,680 | B2 | 5/2014 | Roohparvar | |
| 8,767,473 | B2 | 7/2014 | Shim | |
| 2008/0198650 | A1* | 8/2008 | Shalvi | G11C 16/26 365/185.02 |
| 2010/0131826 | A1* | 5/2010 | Shalvi | G11C 11/5621 714/763 |
| 2010/0157675 | A1* | 6/2010 | Shalvi | G11C 16/3418 365/185.03 |
| 2012/0163080 | A1* | 6/2012 | Shalvi | G11C 11/5628 365/185.03 |
| 2013/0268724 | A1 | 10/2013 | Seo et al. | |
| 2014/0226397 | A1 | 8/2014 | Ahn | |
| 2014/0344519 | A1 | 11/2014 | Gurgi et al. | |

* cited by examiner

*Primary Examiner* — Aracelis Ruiz
(74) *Attorney, Agent, or Firm* — Meyertons, Hood, Kivlin, Kowert & Goetzel, P.C.

(57) ABSTRACT

A method in a memory that includes multiple analog memory cells arranged in a three-dimensional (3-D) configuration, includes identifying multiple groups of potentially-interfering memory cells that potentially cause interference to a group of target memory cells. Partial distortion components, which are inflicted by the respective groups of the potentially-interfering memory cells on the target memory cells, are estimated. The partial distortion components are progressively accumulated so as to produce an estimated composite distortion affecting the target memory cells, while retaining only the composite distortion and not the partial distortion components. The target memory cells are read, and the interference in the target memory cells is canceled based on the estimated composite distortion.

20 Claims, 3 Drawing Sheets

DISTORTION CANCELLATION IN 3-D NON-VOLATILE MEMORY

PRIORITY INFORMATION

This application claims priority to U.S. patent application Ser. No. 13/897,944, entitled "DISTORTION CANCELLATION IN 3-D NON-VOLATILE MEMORY," filed May 20, 2013, which is hereby incorporated by reference in its entirety as though fully and completely set forth herein.

TECHNICAL FIELD

Embodiments disclosed herein relate generally to data storage, and particularly to methods and systems for distortion cancellation in three-dimensional memory devices.

BACKGROUND

Various methods for distortion estimation and compensation in non-volatile memories are known in the art. For example U.S. Pat. No. 8,050,086, whose disclosure is incorporated herein by reference, describes a method for operating a memory (28). The method includes storing data in a group of analog memory cells (32) of the memory as respective first voltage levels. After storing the data, second voltage levels are read from the respective analog memory cells. The second voltage levels are affected by cross-coupling interference causing the second voltage levels to differ from the respective first voltage levels. Cross-coupling coefficients, which quantify the cross-coupling interference among the analog memory cells, are estimated by processing the second voltage levels. The data stored in the group of analog memory cells is reconstructed from the read second voltage levels using the estimated cross-coupling coefficients.

U.S. Pat. No. 8,060,806, whose disclosure is incorporated herein by reference, describes a method for operating a memory (24). The method includes storing data in analog memory cells (32) of the memory by writing respective analog values to the analog memory cells. A set of the analog memory cells is identified, including an interfered cell having a distortion that is statistically correlated with the respective analog values of the analog memory cells in the set. A mapping is determined between combinations of possible analog values of the analog memory cells in the set and statistical characteristics of composite distortion levels present in the interfered memory cell. The mapping is applied so as to compensate for the distortion in the interfered memory cell.

U.S. Pat. No. 8,156,403, whose disclosure is incorporated herein by reference, describes a method for operating a memory device (24). The method includes encoding data using an Error Correction Code (ECC) and storing the encoded data as first analog values in respective analog memory cells (32) of the memory device. After storing the encoded data, second analog values are read from the respective memory cells of the memory device in which the encoded data were stored. At least some of the second analog values differ from the respective first analog values. A distortion that is present in the second analog values is estimated. Error correction metrics are computed with respect to the second analog values responsively to the estimated distortion. The second analog values are processed using the error correction metrics in an ECC decoding process, so as to reconstruct the data.

SUMMARY

An embodiment provides a method including identifying, in a memory that includes multiple analog memory cells arranged in a three-dimensional (3-D) configuration, multiple groups of potentially-interfering memory cells that potentially cause interference to a group of target memory cells. Partial distortion components, which are inflicted by the respective groups of the potentially-interfering memory cells on the target memory cells, are estimated. The partial distortion components are progressively accumulated so as to produce an estimated composite distortion affecting the target memory cells, while retaining only the composite distortion and not the partial distortion components. The target memory cells are read, and the interference in the target memory cells is canceled based on the estimated composite distortion.

In some embodiments, accumulating the partial distortion components includes discarding each partial distortion component after accumulating the partial distortion component into the estimated composite distortion. In other embodiments, accumulating the partial distortion components includes storing the estimated composite distortion in a cache memory having a size that is independent of a number of the groups of the potentially-interfering memory cells.

In yet other embodiments, accumulating the partial distortion components includes summing the partial distortion components. In an embodiment, the method further includes quantizing the partial distortion components. In another embodiment, the method further includes quantizing the estimated composite distortion using non-uniform quantization.

There is additionally provided, in accordance with an embodiment, apparatus including an interface and storage circuitry. The interface is configured to communicate with a memory that includes multiple analog memory cells arranged in a three-dimensional (3-D) configuration. The storage circuitry is configured to identify multiple groups of potentially-interfering memory cells that potentially cause interference to a group of target memory cells, to estimate partial distortion components, which are inflicted by the respective groups of the potentially-interfering memory cells on the target memory cells, to progressively accumulate the partial distortion components so as to produce an estimated composite distortion affecting the target memory cells, while retaining only the composite distortion and not the partial distortion components, to read the target memory cells, and to cancel the interference in the target memory cells based on the estimated composite distortion.

There is also provided, in accordance with an embodiment, apparatus including a memory and storage circuitry. The memory includes multiple analog memory cells arranged in a three-dimensional (3-D) configuration. The storage circuitry is configured to identify multiple groups of potentially-interfering memory cells that potentially cause interference to a group of target memory cells, to estimate partial distortion components, which are inflicted by the respective groups of the potentially-interfering memory cells on the target memory cells, to progressively accumulate the partial distortion components so as to produce an estimated composite distortion affecting the target memory cells, while retaining only the composite distortion and not the partial distortion components, to read the target memory cells, and to cancel the interference in the target memory cells based on the estimated composite distortion.

The present disclosure will be more fully understood from the following detailed description of the embodiments thereof, taken together with the drawings in which:

DETAILED DESCRIPTION OF EMBODIMENTS

Overview

Figure 1:
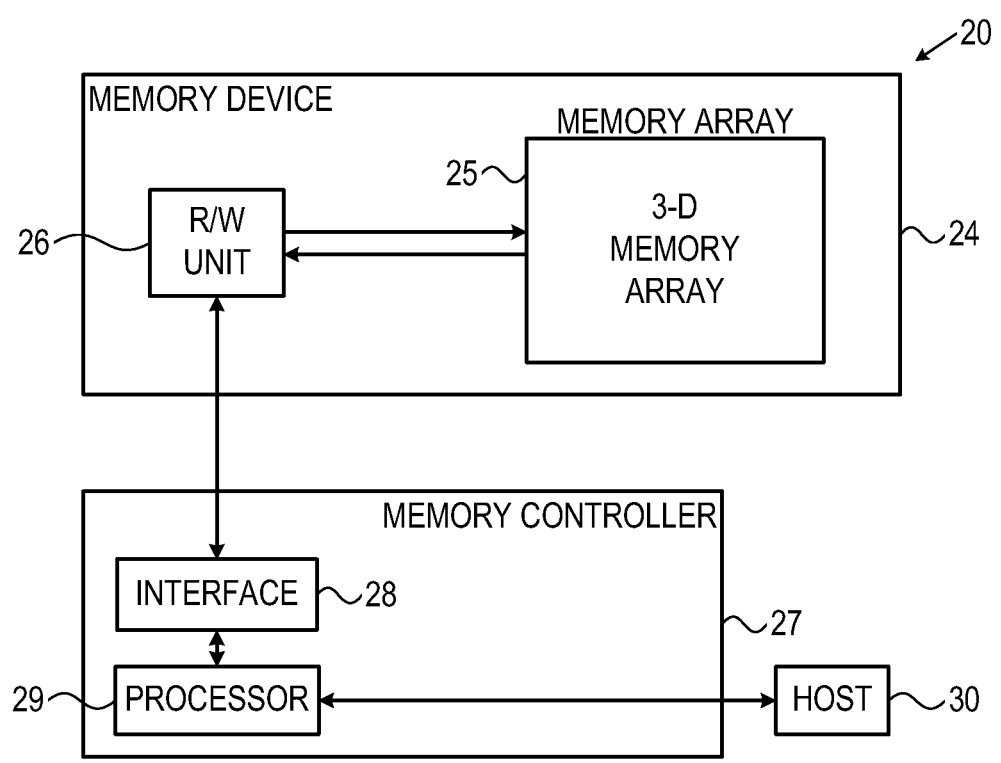
FIG. 1 is a block diagram that schematically illustrates a memory system, in accordance with an embodiment.

Embodiments that are described herein provide improved methods and systems for data storage in three-dimensional (3-D) non-volatile memory. In the disclosed embodiments, a memory controller stores data in a memory that comprises multiple analog memory cells, such as Flash cells, which are arranged in a 3-D configuration. The three dimensions of the memory are associated with Word Lines (WLs), Bit Lines (BLs) and sections, i.e., each memory cell is connected to a certain WL and a certain BL, and lies in a certain section.

Reading data stored in the analog memory cells typically involves reading the cell threshold voltages. The threshold voltage values read from analog memory cells are sometimes distorted. The distortion is due to various reasons, such as disturb noise caused by operations on other cells in the array, electrical field coupling from neighboring memory cells, Back Pattern Dependency (BPD) caused by other cells along the same column or string of the array, to name a few.

Distorted threshold voltages significantly reduce reading reliability. In some 3-D memories, program disturb created by other cells in the array may be severe. For example, in memories wherein each word line is connected to multiple sections, significant inter-section disturb may result in severe performance degradation.

In some embodiments that are described herein, a memory cell is subject to interference, typically program disturb, from multiple interfering cells. The memory controller estimates partial distortion components inflicted by the respective interfering cells, and gradually accumulates an estimate of the composite interference (distortion) affecting the target memory cell. The memory controller retains only the gradually-accumulated estimate of the composite distortion, and discards the partial distortion components and the information that was used to estimate them, thus significantly improving memory utilization.

In some embodiments, the memory controller quantizes the estimated partial distortion components and/or the composite distortion estimation, further improving memory utilization. In some embodiments the quantization is non-linear.

The methods and systems described herein considerably reduce the amount of memory required for distortion estimation and cancellation in 3-D memory. When using these techniques, storage reliability is increased, e.g., since the memory controller is able to account for a large number of interfering cells. Moreover, the memory can be designed with a larger number of sections and therefore with larger capacity, without performance degradation due to interference. The disclosed techniques are particularly effective when the composite distortion is made-up of a large number of partial distortion components.

Although the embodiments described herein focus mainly on program disturb interference in 3-D memories, the disclosed techniques can be used, mutatis mutandis, with other types of memory (e.g., 2-D) and/or other distortion mechanisms.

System Description

FIG. 1 is a block diagram that schematically illustrates a memory system 20, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a three-dimensional (3-D) memory cell array 25. The memory array comprises multiple 3-D memory blocks. Each memory block comprises multiple analog memory cells. The structure of memory cell array 25 is explained in detail below. In the context of the present patent application and in the claims, the term "analog memory cell" is used to describe any memory cell that holds a continuous, analog value of a physical parameter, such as an electrical voltage or charge. Array 25 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 26, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 25, R/W unit 26 converts the storage values of the memory cells into digital samples having a resolution of one or more bits. Data is typically written to and read from the memory cells in groups that are referred to as pages. In some embodiments, the R/W unit can erase a group of cells by applying one or more negative erasure pulses to the cells. Erasure is typically performed in entire memory blocks.

The storage and retrieval of data in and out of memory device 24 is performed by a memory controller 27. The memory controller comprises an interface 28 for communicating with memory device 24, and a processor 29 that carries out the various memory management functions. Memory controller 27 communicates with a host 30, for accepting data for storage in the memory device and for outputting data retrieved from the memory device. Memory controller 27, and in particular processor 29, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present disclosure, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 27. In the exemplary system configuration shown in FIG. 1, memory device 24 and memory controller 27 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 27 can be implemented in software and carried out by a processor or other element of the host system. In some embodiments, host 30 and memory controller 27 may be fabricated on the same die, or on separate dies in the same device package.

In some embodiments, memory controller 27 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The description that follows describes techniques for distortion estimation and cancellation in memory array 25. The disclosed techniques can be carried out by memory controller 27 and/or by R/W unit 26. For the sake of clarity, the description that follows refers to a particular division of functions between R/W unit 26 in the memory device and processor 29 in memory controller 27. Generally, however, the various tasks making-up the disclosed techniques can be divided between the memory controller and the R/W unit in any suitable manner, or performed by any one of these elements. Thus, in the context of the present patent application and in the claims, memory controller 27 and R/W unit 26 are referred to jointly as storage circuitry that carries out the disclosed techniques.

3-D Memory Structure

Figure 2:
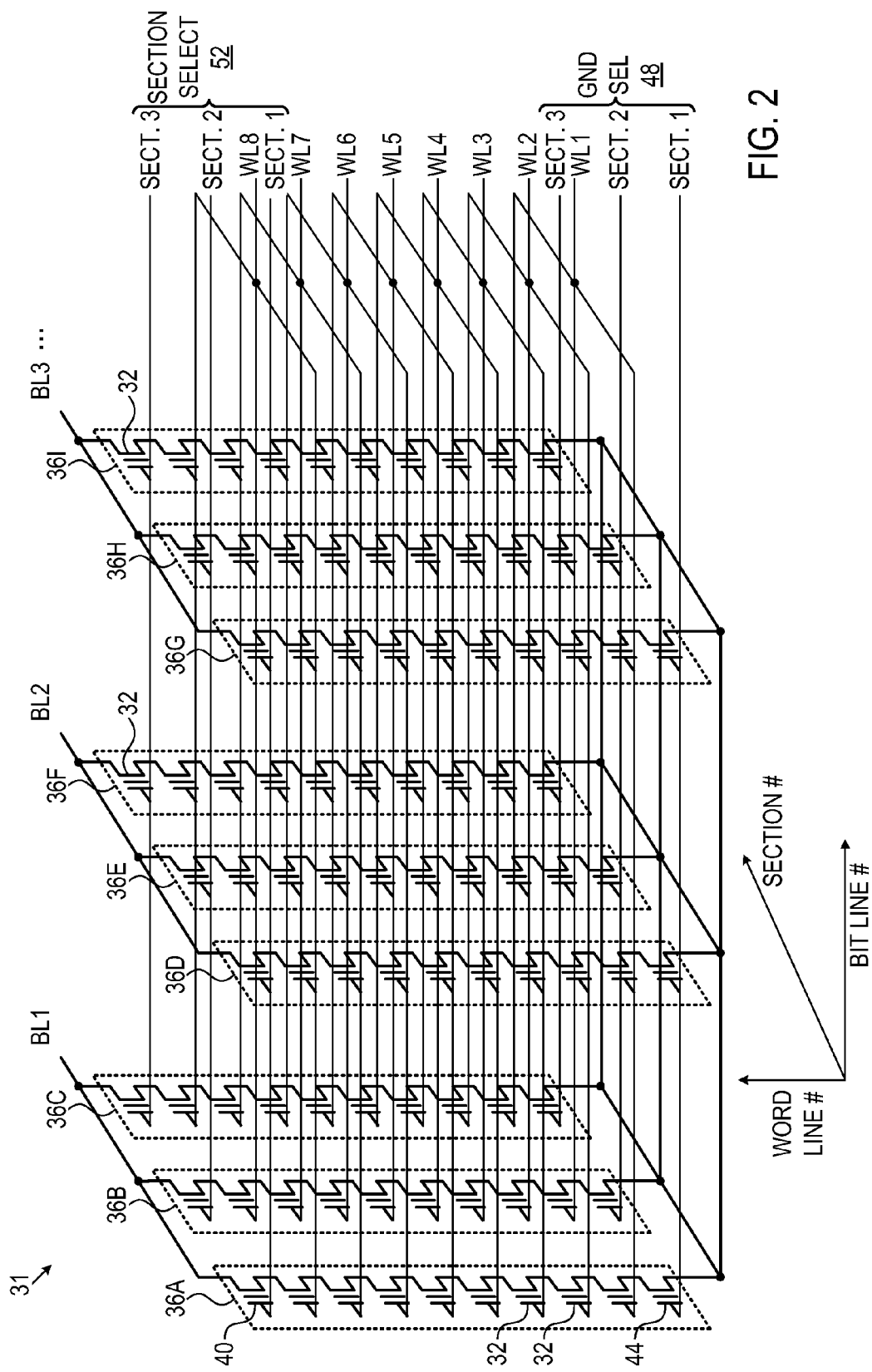
FIG. 2 is a block diagram that schematically illustrates a three-dimensional (3-D) memory block, in accordance with an embodiment.

FIG. 2 is a block diagram that schematically illustrates the internal structure of a 3-D memory block in array 25, in accordance with an embodiment. The figure shows a single 3-D memory block for the sake of clarity. The other memory blocks in array 25 typically have a similar structure. Note that the configuration of FIG. 2 shows the topology and electrical connectivity of block 31, but not necessarily the physical arrangement of the memory cells. An example physical implementation is described further below.

Memory block 31 comprises multiple memory cells 32 that are arranged in a three-dimensional structure. The three dimensions of the memory block are associated with bit lines (denoted BL1, BL2, BL3, . . . ), word lines (denoted WL1 . . . WL8) and sections (denoted SECTION1, SECTION2, SECTION3), respectively. The sections are selected using section select lines 52 (one line for each respective section) and ground select lines 48 (one line for each respective section). A block may comprise, for example, four or more sections, and in some embodiments eight or even sixteen sections. The WLs, BLs, section select lines and ground select lines are accessed by R/W unit 26, as will be explained below.

Each memory cell 32 belongs to a certain cell string 36. The figure shows nine strings denoted 36A . . . 36I. Strings 36A, 36D, 36G, . . . belong to SECTION1, strings 36B, 36E, 36H, . . . belong to SECTION2, and strings 36C, 36F, 36I, . . . belong to SECTION3. The figure shows only the first three strings of each section for the sake of clarity. The 3-D memory block typically comprises thousands of bit lines, and thus thousands of strings in each section.

In each string, each memory cell is connected to a respective WL. The number of memory cells per string is thus equal to the number of WLs. As can be seen in the figure, the first WL is connected to the first memory cell in all the strings of all the sections of the block, the second WL is connected to the second memory cell in all strings, and so on.

A page of data is typically written by R/W unit 26 to a group of memory cells 32 that belongs to a certain WL and lies in a certain section. In a Multi-Level Cell (MLC) device, two or more pages can be written to the same group of cells. For example, a page of data can be written to the first memory cells in strings 36A, 36D, 36G, . . . , i.e., the group of memory cells belonging to WL1 and to SECTION1. Another page can be written to the second memory cells in strings 36A, 36D, 36G, . . . , i.e., the group of memory cells belonging to WL2 and to SECTION1. Similarly, a page can be written to the $i^{th}$ memory cells (i=1 . . . 8) of the strings of any section. Data readout is also performed by page in a similar manner.

In order to access a certain set of strings 36, e.g., for writing or reading data, R/W unit 26 enables the appropriate strings using section select lines 52 and ground select lines 48. Each string 36 comprises a string select switch 40 that is controlled by the appropriate section select line 52, and a ground select switch 44 that is controlled by the appropriate ground select line 48. For example, in order to access a page of data that is stored in SECTION2, R/W unit 26 selects the section select line 52 and the ground select line 48 of SECTION2, and then accesses the WL to which the group of cells belongs. Typically, when selecting a certain section, R/W unit 26 de-selects all other sections.

The configuration of block 31 shown in FIG. 2 is an example configuration that is chosen purely for the sake of conceptual clarity. In alternative embodiments, any other suitable configuration can be used. Moreover, the configuration of FIG. 2 shows the topology and electrical connectivity of block 31, but not necessarily the physical arrangement of the memory cells and strings. In an example physical implementation, each string 36 is U-shaped and the U-shaped strings are fabricated on a common substrate. In this "folded" implementation both section select lines 52 and ground select lines 48 are accessible from the top of the device. Block 31 may be fabricated, for example, using a Silicon-Oxide-Nitride-Oxide-Silicon (SONGS) process, or using any other suitable semiconductor process.

Distortion Cancellation in 3-D Memory

In 3-D memory configurations, a target memory cell is typically subject to interference from multiple interfering cells, such as program disturb caused by operations on cells in other sections that share the same WL&BL as the target cell. Particularly in program disturb, interference has little or no dependence on the physical proximity between the target and interfering cells, and therefore the number of interferers may be large.

As an example, assume that the memory controller programs a target page into a group of cells belonging to SECT2 and WL3 in FIG. 2. The memory controller selects SECT2 using respective section select lines 52 and ground select lines 48. While programming certain data (e.g., using a program and verify method), the memory controller typically applies a sequence of programming pulses to the selected WL in order to charge the memory cells to voltage levels that represent the data.

Since, however, each WL connects to all the sections, some charge may leak into cells in non-selected sections, i.e., SECT1 and SECT2. In the present example, cells in pages selected by WL3 and SECT1 or SECT2 may be therefore unintentionally charged. In particular, cells that are fully programmed at the time of programming the target cell, may acquire extra charge or voltage that cannot be compensated for at programming time.

At some future point in time, the memory controller may read the target page. In the present example, the memory controller again selects SECT2 and WL3 for reading the page. As WL3 connects to all the sections, cells connected to WL3 in all the sections potentially interfere with the threshold voltages of the cells in the target page. In other words, data programmed in WL3 pages of other sections may change the threshold voltages read from the target page. In 3-D configurations having many sections, the overall interference becomes cumulatively strong and may degrade reading reliability.

It may be possible in principle to read all the interferer pages, cache their data and use the cached data to estimate the composite distortion that affects the target page. This sort of solution, however, requires large and expensive RAM. Embodiments included in the present disclosure, on the other hand, enable accurate estimation of distortion caused by many interferers, while at the same time requiring only modest memory size.

Figure 3:
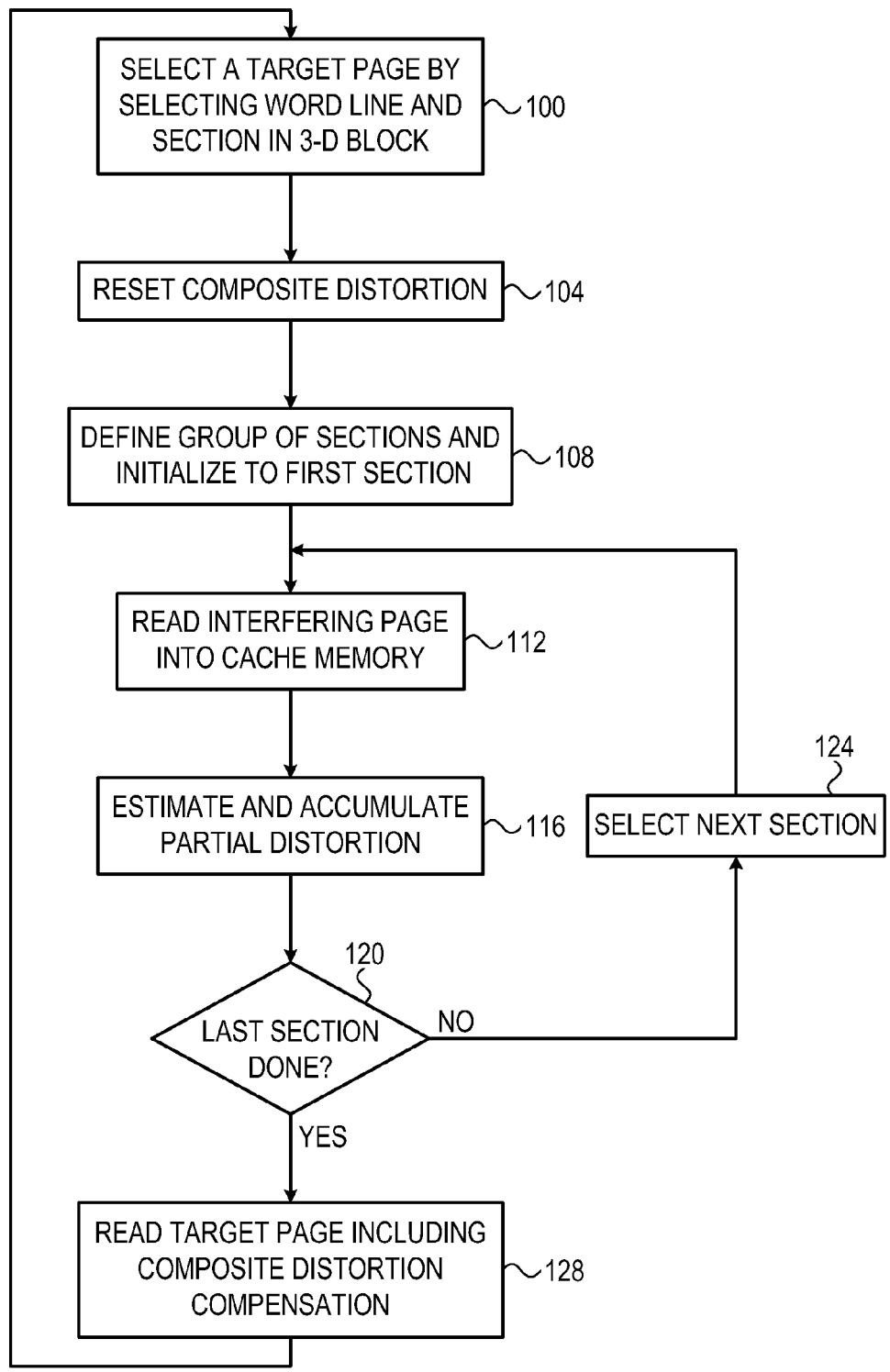
FIG. 3 is a flow chart that schematically illustrates a method for memory distortion cancellation, in accordance with an embodiment.

FIG. 3 is a flow chart that schematically illustrates a method for memory distortion cancellation, in accordance with an embodiment. The method begins with memory controller 27 selecting a target page for reading, at a target selection step 100. The memory controller selects the memory cells that store the target page by selecting a respective section and word line. In the example of FIG. 2, the memory controller can select one of the word lines WL1 ... WL8, and one out of three sections, i.e., SECT1, SECT2, or SECT3. Memory controller 27 resets a composite distortion value, at a reset step 104. The composite distortion accumulates estimated partial distortion components as explained below.

Next, the memory controller loops over sections comprising potentially interfering pages. An interfering page comprises cells that may distort reading threshold levels of cells that belong to the target page. The memory controller defines a group of sections comprising potentially interfering pages at an initialization step 108. The memory controller can define any suitable set of sections, and loop over or scan the sections in any suitable order.

For example, the memory controller may loop over all the memory sections sequentially starting with SECT1. Alternatively, the memory controller may loop over all the sections in any other order. Further alternatively, the memory controller may loop over any suitable partial subset of the sections and in any suitable order. For example, the memory controller may consider only the sections adjacent to the section of the target page. In the present example, the defined group of sections typically excludes the section of the target page. In general, it is assumed that the defined group of sections comprises pages that significantly interfere with the target page and therefore contribute significant partial distortion components. Further at step 108, prior to looping, the memory controller initializes to a first selected section out of the defined group of sections.

The memory controller then reads a potentially interfering page, at a read step 112. In the present example, both the target page of step 100 and each of the potentially interfering pages belong to the same word line. Generally, however, the target and interfering pages may belong to different word lines. The data of the page read at step 112 is stored in a cache memory, e.g., a Random Access Memory (RAM) of the memory controller.

Memory controller 27 estimates a partial distortion value (also referred to as a partial distortion component) based at least on the data read from the interfering page and stored in the cache, at an accumulation step 116. Memory controller 27 can use any suitable method for distortion estimation as known in the art. Distortion estimation methods are described, for example, in U.S. Pat. Nos. 8,050,086, 8,060, 806 and 8,156,403, cited above.

In alternative embodiments the reading and estimating operations at steps 112 and 116 may be carried out simultaneously, thus directly store the partial distortion in the cache. Still at step 116, the memory controller accumulates the estimated partial distortion component into the composite distortion. The memory controller may use any suitable method for accumulating the partial distortion components.

For example, the memory controller may perform accumulation using a simple or weighted sum of the partial distortion components. The values of the estimated partial and/or the composite distortion at steps 112 and 116 may be additionally quantized to a low resolution representation to improve memory utilization as explained further below.

An advantage of the described method stems from re-using the memory cache at step 112. In some embodiments, the cache size fits the size of a single data page. More generally, since the memory controller retains only the composite distortion estimate and not the individual partial distortion components, the memory size needed for this function in the memory controller is independent of the number of groups of interfering memory cells. This independence makes the disclosed techniques particularly attractive for scenarios involving many interferers.

In each loop iteration, following the accumulation of a partial distortion, data in the cache that was used for estimating that partial distortion may be discarded. The memory controller thus overwrites data stored in the cache at the previous iteration with new data or partial distortion components derived from the interfering page read in the current iteration.

The memory controller checks if all the sections defined at step 108 are already scanned, at a loop termination step 120. In case there are additional sections to scan, the memory controller selects the next section at a selection step 124, and loops back to step 112 to read subsequent interfering pages.

Otherwise, the composite distortion at step 116 has fully accumulated all the partial distortion components, and the memory controller proceeds to a read target step 128. At step 128 the memory controller reads the target page, and uses the composite distortion to perform distortion compensation thus improving the read operation reliability. The memory controller may use any distortion compensation method as known in the art. Distortion compensation methods are described, for example, in U.S. Pat. Nos. 8,050,086, 8,060, 806 and 8,156,403, cited above.

Following step 128 the memory controller loops back to step 100 to select another target page to read.

The configuration described in the method of FIG. 3 is an exemplary configuration, and other suitable configurations may be used in alternative embodiments. For example, in the method of FIG. 3, only a page selected in a section other than the section of the target page, and belonging to the same word line as the target page, is considered as an interfering page. In an alternative embodiment, any suitable group of sections and interfering pages thereof may be used.

For example, multiple pages per section may be considered as potentially interfering with the target page, as well as pages that lie in the same section as the target page. The memory controller can perform a double loop procedure, wherein the outer loop selects sections similarly to the method of FIG. 3 above, possibly including the section of the target page itself. An inner loop selects multiple interfering pages in each section by selecting respective word lines.

The method of FIG. 3 is described using pages of cells, i.e., a full row of cells. Alternatively, any suitable subsets of such pages may be used. For example, the method may be carried out for half pages comprising odd/even cells in a row.

The method of FIG. 3 above was described referring to 3-D memory arrays. The method is however applicable in 2-D memory arrays as well. In a 2-D configuration there is effectively a single section. In an alternative embodiment, the method of FIG. 3 may be adapted to loop over word lines of the 2-D memory array excluding the word line of target page.

Quantized Composite Distortion

In some embodiments, it is sufficient to represent partial and/or composite distortion at a low resolution such a 3-bit resolution (or any other suitable resolution). Representing distortion values at low resolutions significantly improves the memory utilization in memory controller 27. At steps 116 and 128 above, for example, the memory controller can apply resolution reduction to the estimated partial distortion components, to the final accumulated composite distortion, or to both. Additionally or alternatively, the memory controller may apply, at step 116, resolution reduction to the gradually-accumulating values of the composite distortion, i.e., before the loop terminates at step 120.

The memory controller may use any suitable method for resolution reduction. For example, the memory controller may use any suitable uniform and/or non-uniform quantization techniques as known in the art.

The structure of a 3-D memory array typically comprises multiple sections, wherein each section contributes partial distortion components created by one or more interfering pages. As a result, the probability distribution of the composite distortion calculated by accumulating the partial distortion components may be well approximated by a Gaussian distribution. Since for Gaussian distribution, non-uniform quantization typically outperforms uniform quantization in terms of signal to quantization-noise ratio, the memory controller may apply non-uniform quantization to the final accumulated composite distortion. Non-uniform quantization methods known in the art include, for example, configurations that employ A-law or p-law schemes.

In some embodiments, the quantization methods described above may be combined with any interference or distortion cancellation method. For example, memory controller 27 may combine quantization of discrete distortion values with digital cancellation methods. R/W unit 26 may combine quantization of continuous distortion values with analog cancellation methods.

It will be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a memory, including a plurality of pages, wherein each page of the plurality of pages includes a plurality of memory cells; and
a controller configured to:
select a first page of the plurality of pages;
read each page of a subset of the plurality of pages, wherein the subset of the plurality of pages excludes the first page;
estimate a respective partial distortion value dependent on results read from each page of the subset of the plurality of pages;
reduce a resolution of each partial distortion value;
accumulate each partial distortion value to generate a composite distortion value; and
read the first page dependent upon the composite distortion value.

2. The apparatus of claim 1, wherein each memory cell of the plurality of memory cells included in a given page of the plurality of pages is coupled to a common word line.

3. The apparatus of claim 1, wherein the controller is further configured to reset the composite distortion value.

4. The apparatus of claim 1, wherein to accumulate each partial distortion value, the controller is further configured to add a given partial distortion value to a current value of the composite distortion value.

5. The apparatus of claim 1, wherein to accumulate each partial distortion value, the controller is further configured to calculate a weighted average of each partial distortion value.

6. The apparatus of claim 1, wherein to read each page of the subset of the plurality of pages, the controller is further configured to store the results read from each page in a cache memory.

7. A method, comprising:
selecting a first page of a plurality of pages of a memory, wherein each page of the plurality of pages includes a plurality of memory cells;
reading each page of a subset of the plurality of pages, wherein the subset of the plurality of pages excludes the first page;
estimating a respective partial distortion value dependent on results read from each page of the subset of the plurality of pages;
reducing a resolution of each partial distortion value;
accumulating each partial distortion value to generate a composite distortion value; and
reading the first page dependent upon the composite distortion value.

8. The method of claim 7, wherein each memory cell of the plurality of memory cells included in a given page of the plurality of pages is coupled to a common word line.

9. The method of claim 7, further comprising resetting the composite distortion value.

10. The method of claim 7, wherein accumulating each partial distortion value includes adding a given partial distortion value to a current value of the composite distortion.

11. The method of claim 7, wherein accumulating each partial distortion value includes calculating a weighted average of each partial distortion value.

12. The method of claim 7, wherein reading each page of the subset of the plurality of pages includes storing the results read from each page in a cache memory.

13. The method of claim 7, wherein estimating the respective partial distortion value includes quantizing the respective partial distortion value.

14. A system, comprising:
   a host; and
   a memory coupled to the host, wherein the memory includes a plurality of pages, wherein each page of the plurality of pages includes a plurality of memory cells, wherein the memory is configured to:
      select a first page of the plurality of pages;
      read each page of a subset of the plurality of pages, wherein the subset of the plurality of pages excludes the first page;
      estimate a respective partial distortion value dependent on results read from each page of the subset of the plurality of pages;
      reduce a resolution of each partial distortion value;
      accumulate each partial distortion value to generate a composite distortion value; and
      read the first page dependent upon the composite distortion value.

15. The system of claim 14, wherein each memory cell of the plurality of memory cells included in a given page of the plurality of pages is coupled to a common word line.

16. The system of claim 14, wherein the memory is further configured to reset the composite distortion value.

17. The system of claim 14, wherein to accumulate each partial distortion value, the memory is further configured to add a given partial distortion value to a current value of the composite distortion value.

18. The system of claim 14, wherein to accumulate each partial distortion value, the memory is further configured to calculate a weighted average of each partial distortion value.

19. The system of claim 14, wherein to read each page of the subset of the plurality of pages, the memory is further configured to store the results read from each page in a cache memory.

20. The system of claim 14, wherein to estimate the respective partial distortion value, the memory is further configured to quantize the respective partial distortion value.

* * * * *